United States Patent

Sakurai et al.

Patent Number: 5,815,033
Date of Patent: Sep. 29, 1998

[54] INTEGRATED CIRCUIT, VARIABLE FILTER ADJUSTING METHOD THEREFOR, AND ELECTRONIC EQUIPMENT USING THE SAME

[75] Inventors: Katsuhito Sakurai, Hadano; Takahiro Shirai, Isehara; Yasushi Matsuno, Atsugi; Nobuyuki Hirayama, Zama, all of Japan

[73] Assignee: Canon Kabushiki Kaisha, Tokyo, Japan

[21] Appl. No.: 627,114

[22] Filed: Apr. 3, 1996

[30] Foreign Application Priority Data

Apr. 7, 1995 [JP] Japan .................................... 7-082214

[51] Int. Cl.⁶ ........................................... H03B 1/00
[52] U.S. Cl. ........................................... 327/555; 327/553
[58] Field of Search ...................... 327/553, 555

[56] References Cited

U.S. PATENT DOCUMENTS

| 4,818,903 | 4/1989 | Kawano | 327/553 |
| 5,206,913 | 4/1993 | Sims | 381/103 |
| 5,278,516 | 1/1994 | Sakurai | 330/267 |

FOREIGN PATENT DOCUMENTS

0511682A2  4/1992  European Pat. Off. .

OTHER PUBLICATIONS

IEEE Transactions on Consumer Electronics, vol. 39, No. 3, Aug. 1, 1993, pp. 413–420, XP000396312, Futao Yamaguchi et al: "A New Single–Chip Video Signal–Processing LSI For the High–Band 8MM Camcorder".

Electronic Design, vol. 40, No. 9, May 1, 1992, pp. 56–57, 60, 64–66, 69, XP000334857 Goodenough F: "CMOS Now Dominates Analog, Mixed–Signal IC Designs".

Primary Examiner—David C. Nelms
Assistant Examiner—Hoai Ho
Attorney, Agent, or Firm—Fitzpatrick, Cella, Harper & Scinto

[57] ABSTRACT

The present invention is to provide an integrated circuit capable of reducing the substrate area, a variable filter adjusting method for the integrated circuit, and an electronic equipment using the integrated circuit, in which disorder of an external element and its temperature characteristic can be automatically corrected following the adjustment of disorder of the internal elements and their temperature characteristics by performing digital/analog conversion of a control signal to be input to a first adjustment unit for adjusting the disorder of internal elements of the integrated circuit and their temperature characteristics, so that the control signal can be input to a second adjustment unit as a reference signal of a digital/analog converter.

12 Claims, 7 Drawing Sheets

SIGNAL WAVEFORM | FREQUENCY DISTRIBUTION

INTEGRATED CIRCUIT, VARIABLE FILTER ADJUSTING METHOD THEREFOR, AND ELECTRONIC EQUIPMENT USING THE SAME

BACKGROUND OF THE INVENTION

1. Field of the Invention

The present invention generally relates to an integrated circuit and, more particularly, to an integrated circuit capable of adjusting characteristics of variable filters, a variable filter adjusting method therefor, and an electronic equipment using the same.

2. Related Background Art

In recent years, an integrated circuit used in image recording/reproducing apparatuses such as VTRs has a tendency to incorporate therein variable filters adjustable inside or from the outside so that disorder of elements, such as resistors, capacitors and transistors, provided within the integrated circuit and their temperature characteristics can be corrected.

The following circuits shown in FIGS. 8 and 9 describe known methods of adjusting such filters.

FIGS. 8 and 9 are circuit block diagrams each showing the main part of such an integrated circuit.

A control circuit including the integrated circuit shown in FIG. 8 is designed to control an inside constant-current source 81 of the integrated circuit 80 using an outside volume 84 so that the current supplied from the constant-current source 81 is mirrored and biased against variable filters 82, 83, and so that the variable filters 82, 83 in the integrated circuit 80 can be adjusted at the same time.

FIG. 9 shows a self adjustment facility for adjusting the filters automatically within the integrated circuit 80, in which a phase comparator 88 makes a phase comparison between a reference signal and a signal after passing through a reference variable filter 87 so that the resulting error can be automatically adjusted by returning it to the reference variable filter 87, and so that the variable filters 82, 83 can be adjusted at the same time by using the signal from the reference variable filter 87 as a control signal for the variable filters 82, 83 in the integrated circuit 80.

As such above, both the conventional circuits are designed to adjust the variable filters 82, 83 in the integrated circuit at the same time on purpose to correct disorder of the elements, such as resistors, capacitors and transistors, incorporated in the integrated circuit 80 and their temperature characteristics.

Consequently, an external variable filter for correcting disorder of an external element, e.g., a variable delay line equalizer 85 correcting a delay amount of a 1H delay line 86 is necessarily located outside of the integrated circuit 80, and problems arise which the substrate increases in area due to the increased number of parts located outside of the integrated circuit.

Further, such a variable filter externally located is generally adjusted with a volume, and it has been difficult to automate the adjustment process.

SUMMARY OF THE INVENTION

The present invention, therefore, is made to solve the above problems and an object thereof is to provide an integrated circuit capable of reducing the substrate area, a variable filter adjusting method for the integrated circuit, and an electronic equipment using the integrated circuit, in which disorder of an external element can be automatically corrected following the adjustment of disorder of internal elements and their temperature characteristics by performing digital/analog conversion of a control signal to be input to a first adjustment unit for adjusting the disorder of the internal elements of the integrated circuit and their temperature characteristics, so that the control signal can be input to a second adjustment unit as a reference signal of a digital/analog converter.

The above object of the present invention is attained by the provision of an integrated circuit including first adjustment means for adjusting disordered response characteristics of the elements integrated within the circuit and their temperature characteristics; second adjustment means for adjusting disordered response characteristic of an element externally connected to the circuit; and correction means for correcting the amount adjusted in the second adjustment means by performing digital/analog conversion of a control signal adjusted by the first adjustment means into a reference signal of a digital/analog converter.

The present invention is also attained by the provision of a variable filter adjusting method for an integrated circuit including first adjustment means for adjusting the disordered response characteristics of elements integrated within the circuit and their temperature characteristics; a first variable filter adjusted by the first adjustment means; and a second variable filter for adjusting disordered response characteristic of an element externally connected to the circuit, the method including the steps of performing digital/analog conversion of a control signal applied to the first variable filter into a reference signal of a digital/analog converter so that the second variable filter can be corrected based on the converted control signal.

Further, the present invention is attained by the provision of an integrated circuit used in an electronic equipment which inputs an image signal, converts the signal, and records it on a recording medium, including a constant-current means for producing an electric current regulated based on a regulating signal; a reception unit for receiving regulating data supplied from the outside; generation means for generating a control signal based on both the constant current supplied from the constant-current source and the regulating data received in the reception unit; and adjustment means for adjusting the image signal fed from the outside based on the control signal generated in the generation means.

Furthermore, the present invention is attained by the provision of an electronic equipment which inputs an image signal, converts the signal, and records it on a recording medium, including a constant-current means for producing an electric current regulated based on a regulating signal; regulating data generation means for generating regulating data; a reception unit for receiving the regulating data; generation means for generating a control signal based on both the constant current fed from the constant-current source and the regulating data received in the reception unit; delay means for generating an image signal delayed by a period of one horizontal scanning after inputting the last image signal; and adjustment means for adjusting the image signal generated in the delay means based on the control signal generated in the generation means.

BRIEF DESCRIPTION OF THE DRAWINGS

The above and other objects and features of the invention are apparent to those skilled in the art from the following preferred embodiments thereof when considered in conjunction with the accompanied drawings, in which.

DETAILED DESCRIPTION OF THE PREFERRED EMBODIMENTS (First Embodiment)

A first embodiment of the present invention will be described below with reference to the drawings.

Figure 1:
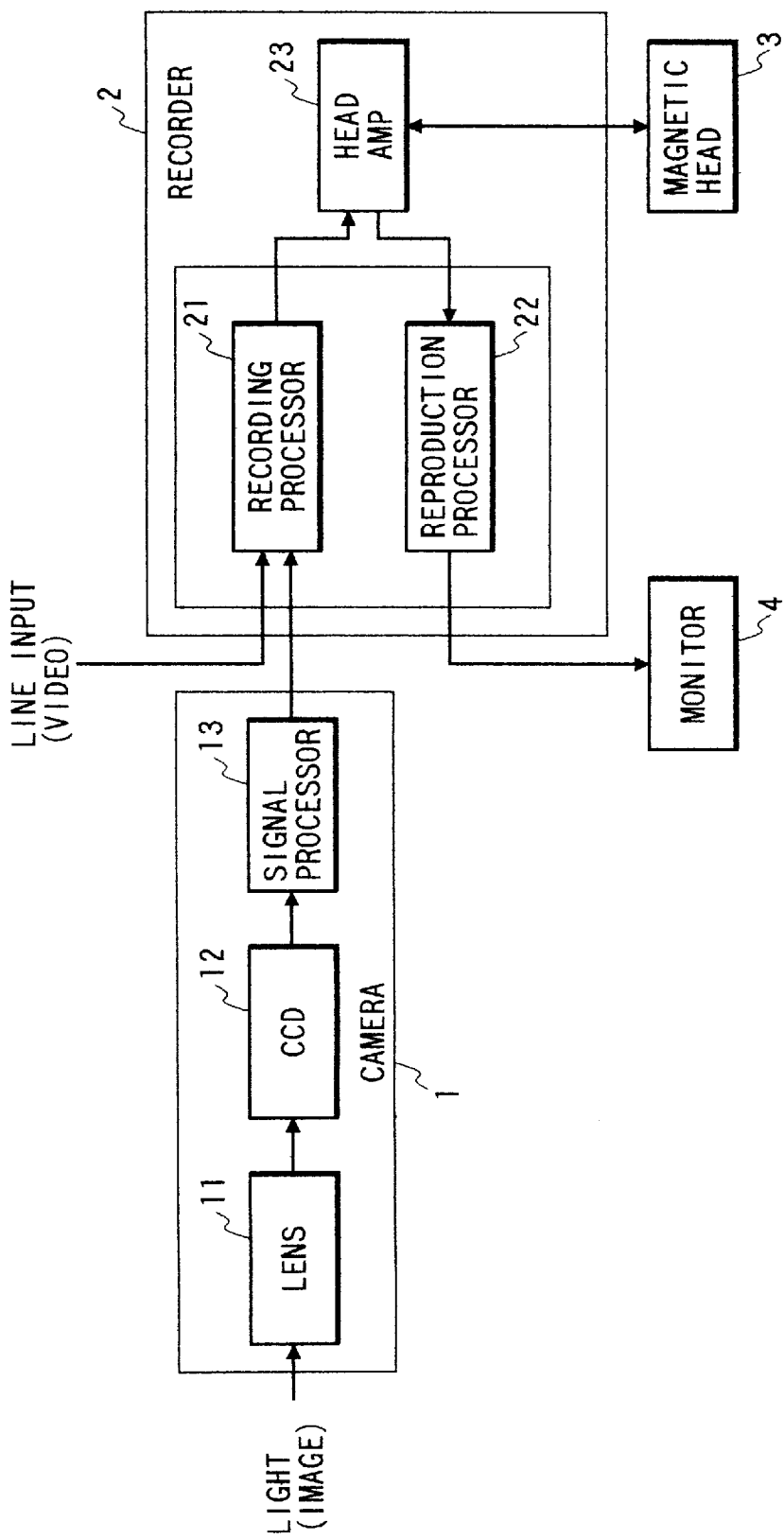
FIG. 1 is a block diagram of an image recording apparatus to which the present invention is applied.

FIG. 1 is a block diagram of an image recording apparatus to which the present invention is applied.

In FIG. 1, a camera 1 constituted of a lens 11, a CCD 12 and a signal processor 13 picks up an image, converts it into an image signal and outputs the signal. A recorder 2 is constituted of a recording processor 21, a reproduction processor 22 and a head amplifier 23. The recorder 2 records the image signal output from the camera 1 or an image output apparatus, not shown, on a recording medium through a magnetic head 3 and displays it on a monitor 4, or reproduces the image signal read out from the recording medium and displays it on the monitor 4.

The recording processor 21 converts the image signal input thereto into a signal for recording it on the recording medium through the magnetic head 3. The reproduction processor 22 converts the image signal read out from the recording medium through the magnetic head 3 into a signal for displaying it on the monitor 4.

Figure 2:
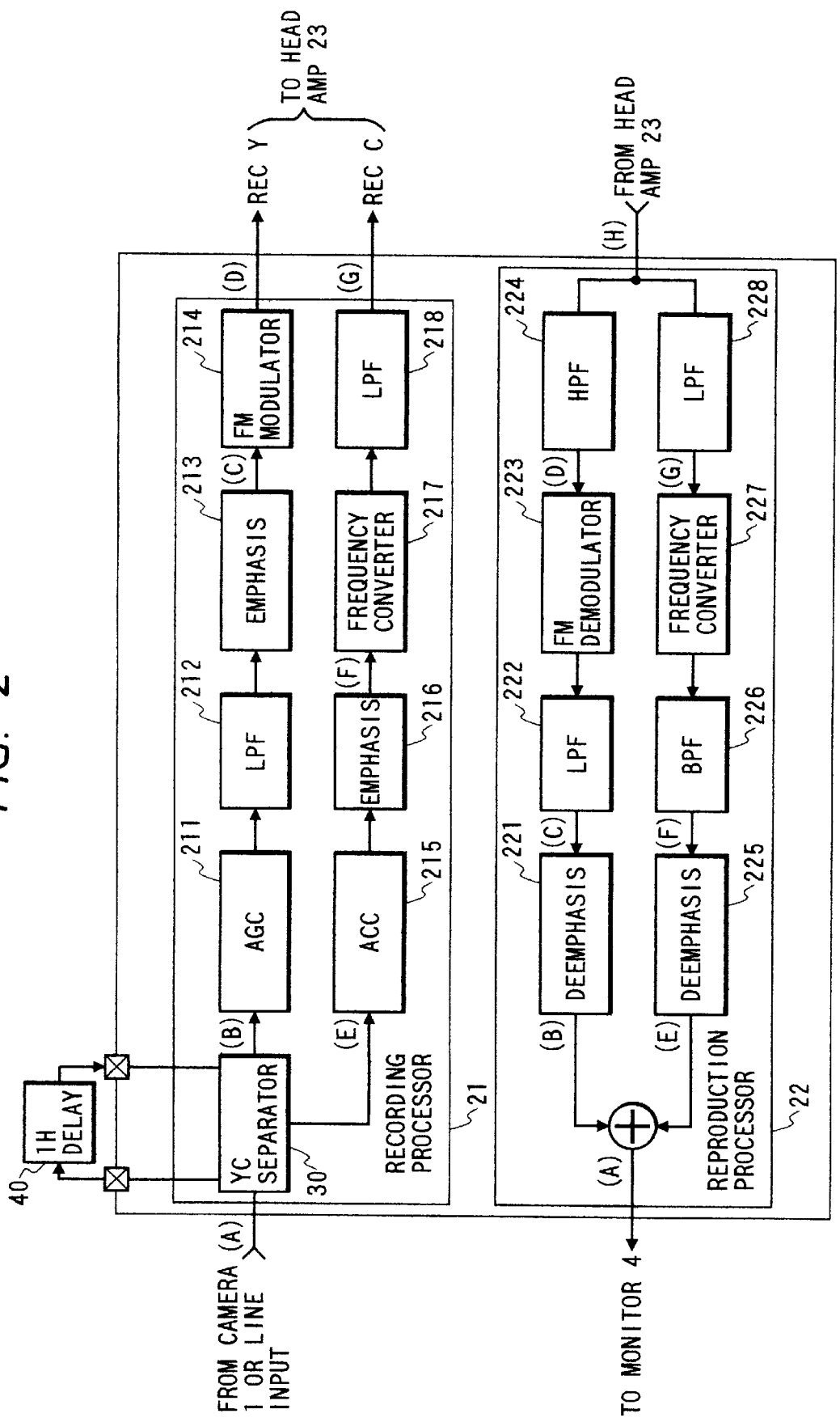
FIG. 2 is a block diagram showing details of a recording processor 21 and a reproduction processor 22 in FIG. 1.

FIG. 2 is a block diagram showing details of the recording processor 21 and the reproduction processor 22, where the processor part constituted of the recording processor 21 and the reproduction processor 22 is made on a one-chip IC.

In FIG. 2, a video signal is input from the camera 1 or an external input to the YC separator 30, separated into a luminance signal (Y signal) and a carrier chrominance signal (C signal) and output to an AGC 211 and an ACC 215. The YC separator 30 is connected to a 1H delay unit 40.

AGC 211, LPF 212, emphasis 213 and FM modulator 214 constitute a Y signal recording system. The AGC 211 adjusts the input signal to an optimum level for inputting it to the FM modulator 214. The LPF 212 prevents the Y signal from being contaminated with a voice carrier-wave or a treble noise included in the input signal. The emphasis 213 emphasizes the frequency of the input signal in a high range; the FM modulator 214 modulates the frequency of the input signal.

On the other hand, ACC 215, emphasis 216, frequency converter 217 and LPF 218 constitute a C signal recording system. The ACC 215 sets the output signal to a constant level even when the input signal varies in level. The emphasis 216 emphasizes the input signal. The frequency converter 217 converts the frequency of the input signal; the LPF 218 removes high-range frequency component from the input signal converted in the frequency converter 217.

As such above, the signals output from the Y signal recording system and the C signal recording system are sent to the head amplifier 23 so that the video signal can be recorded.

When reproducing a signal recorded on a medium, a converted carrier chrominance signal is cut off and only a luminance signal with a prescribed frequency or more is extracted in an HPF 224 from the signals output from the head amplifier 23. An FM demodulator 223 demodulates the frequency of the input signal; an LPF 222 removes a visual noise from the input signal. Then, a deemphasis 221 returns portions of the signal amplified in the emphasis 213 to an original level.

Meanwhile, an LPF 228 removes a high-range frequency component from the input signal; a frequency converter 227 returns the frequency of the input signal to a frequency before converted in the frequency converter 217. Then, a BPF 226 extracts a signal having a frequency of a prescribed band from all the input signals; a deemphasis 225 returns the signal amplified in the emphasis 216 to an original level.

The composite signal obtained by synthesizing both the signals is sent to the monitor 4 so that the reproduced video image can be watched thereon.

Figure 4A:
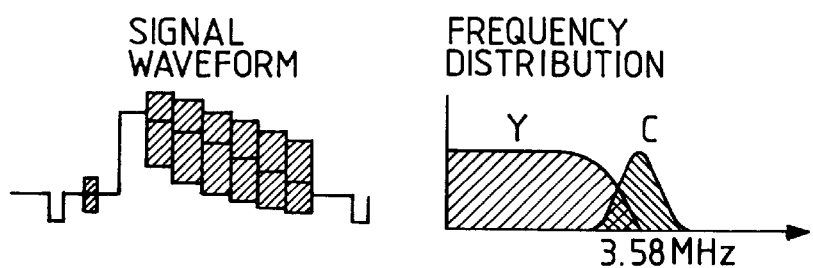
FIGS. 4A to 4H are charts each showing waveform and frequency distribution of signals in each unit in FIG. 2.
Figure 4B:
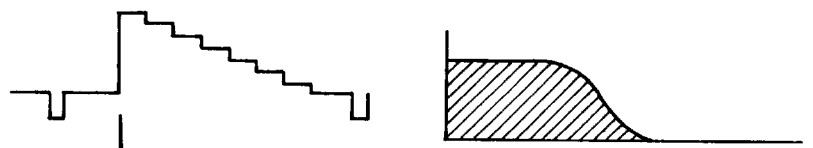
Figure 4C:
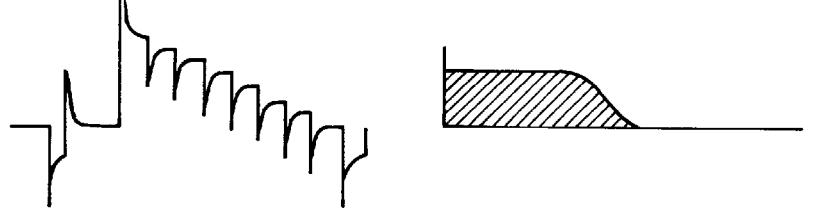
Figure 4D:
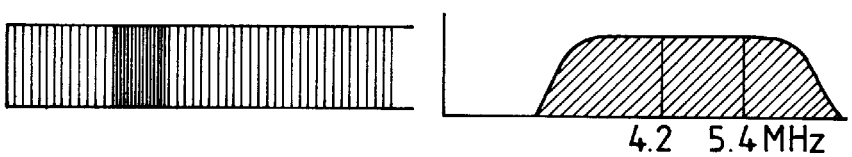
Figure 4E:
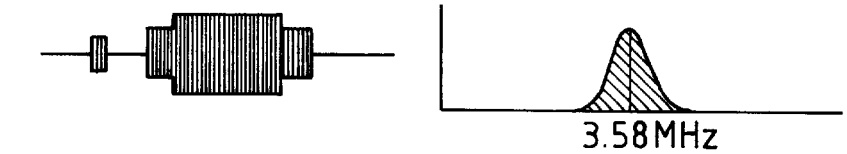
Figure 4F:
Figure 4G:
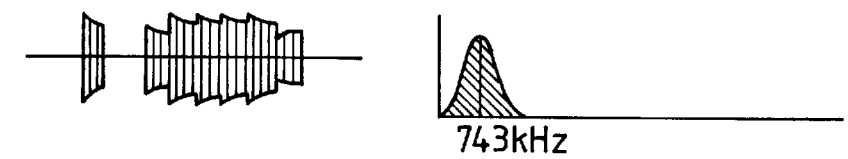
Figure 4H:

FIGS. 4A to 4H are charts each showing waveform and frequency distribution of the signals in each unit in FIG. 2, where FIG. 4A, FIG. 4B, . . . , FIG. 4H show waveform and frequency distribution of the signals in (A), (B), . . . , (H) in FIG. 2, respectively. Each frequency shown in the drawings is an example, which depends on the system.

Figure 3:
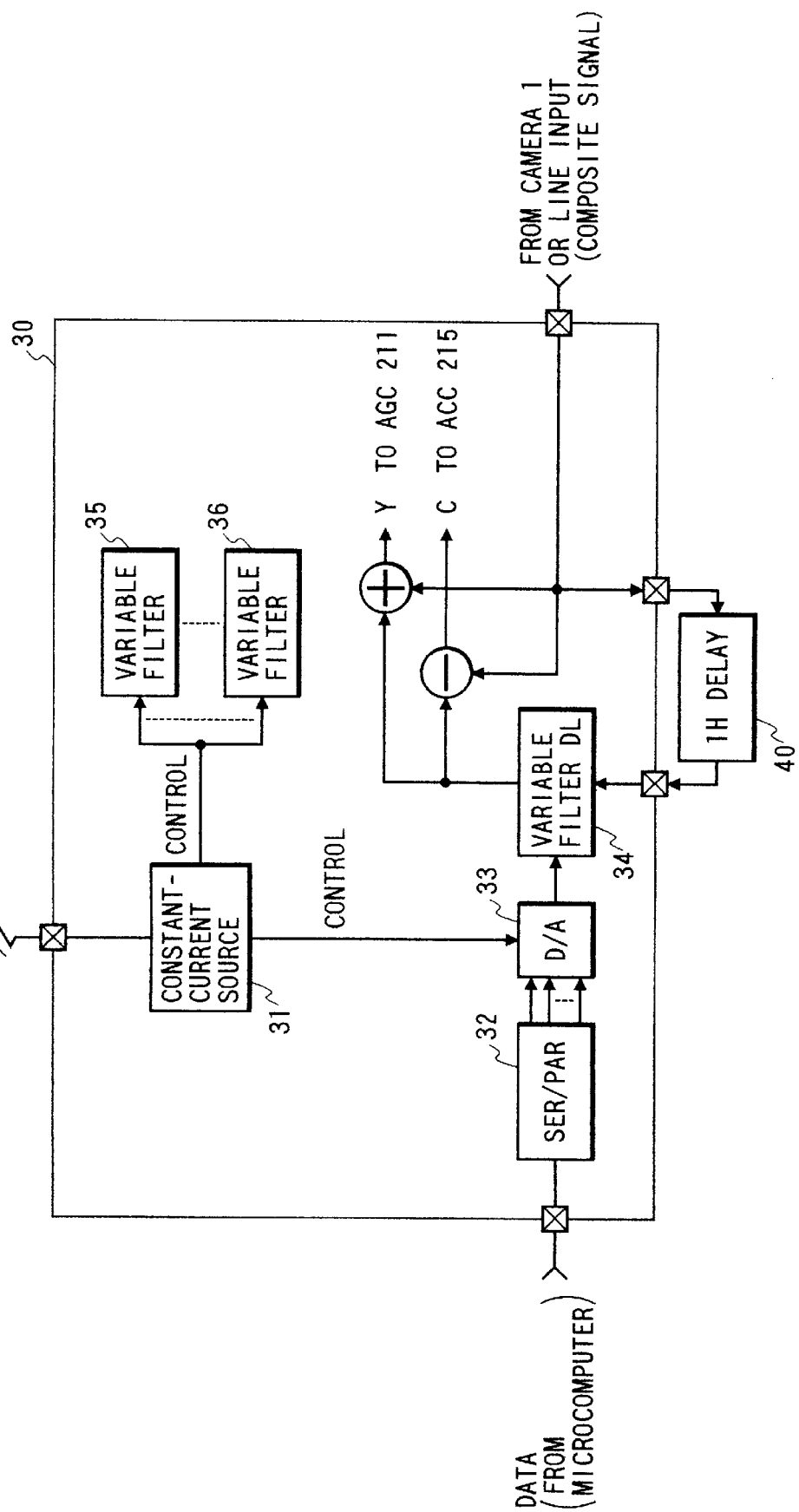
FIG. 3 is a detailed block diagram showing part of a YC separator 30 related to the present invention.
Figure 5A:
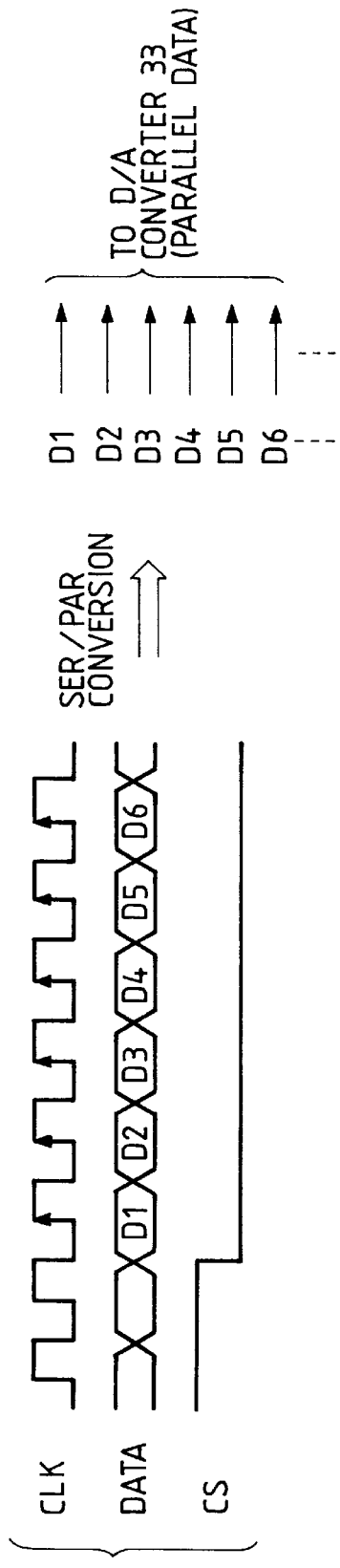
FIGS. 5A and 5B are timing charts showing a relationship of signals in each unit in FIG. 3.
Figure 5B:
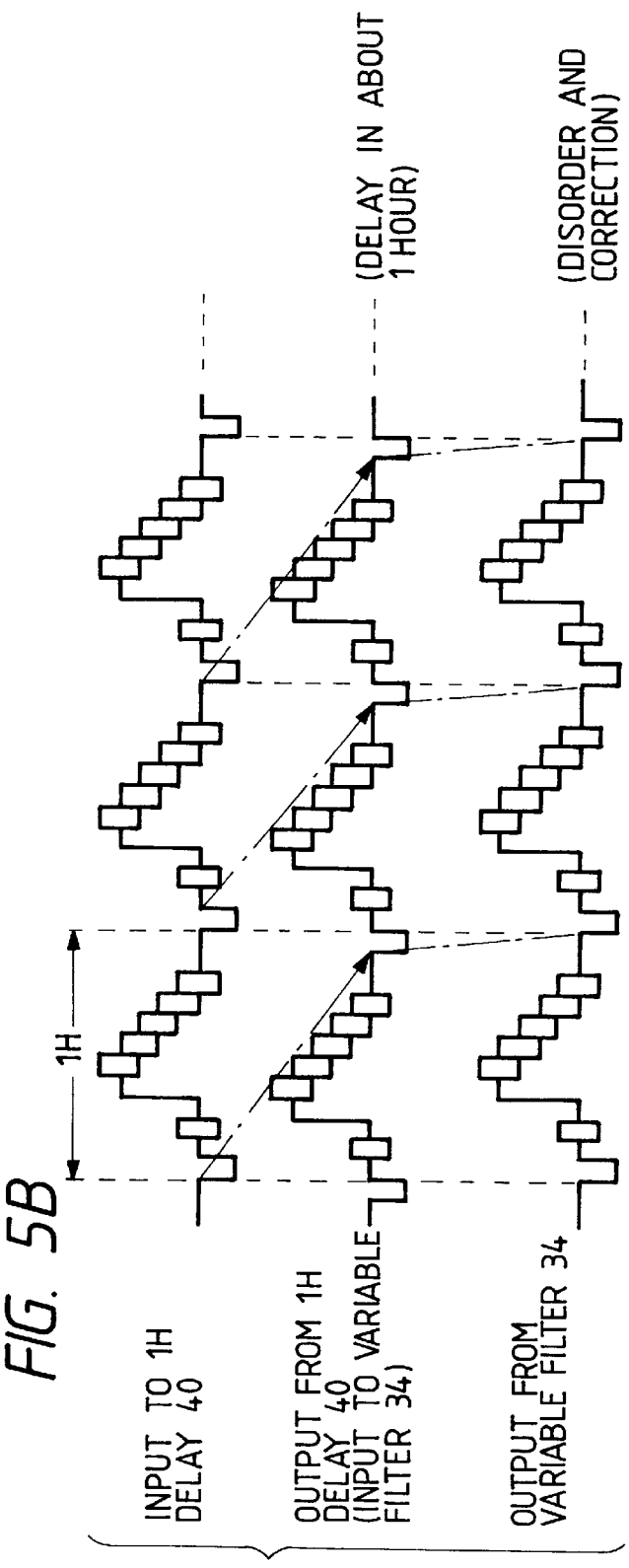
Figure 6:
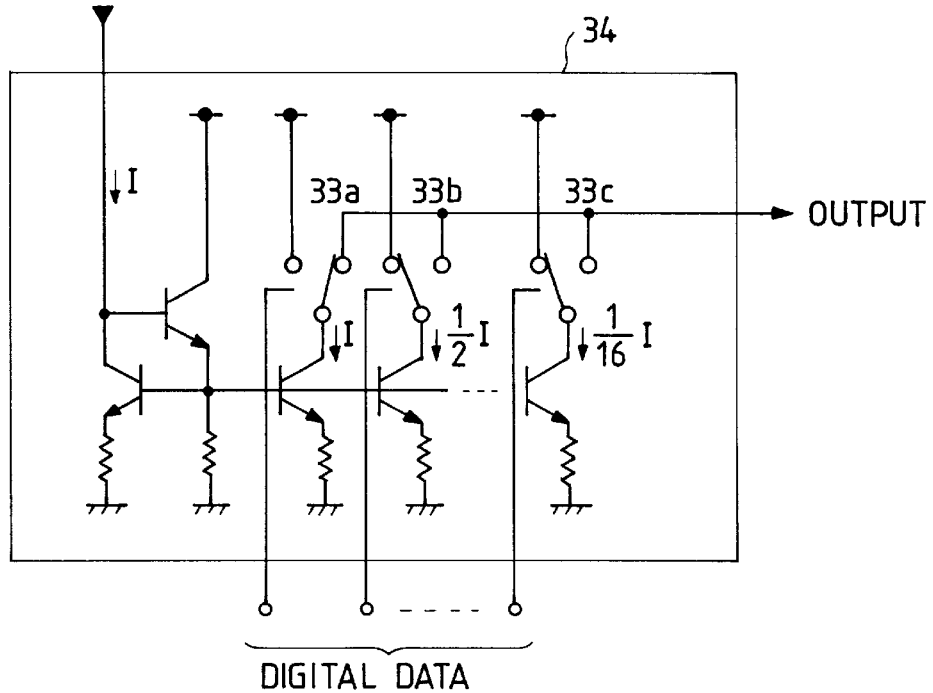
FIG. 6 is a circuit diagram showing an example of a D/A converter 33.

FIG. 3 is a detailed block diagram showing part of the YC separator 30 related to the present invention. In FIG. 3, a constant-current source 31 is controlled with an outside volume 50. The constant current regulated with the volume 50 is mirrored into control signals which are input both to variable filters 35, 36 as biased signals and a D/A converter 33. The D/A converter 33 the circuit structure of which is shown in FIG. 6 controls switches 33a, . . . , 33c in response to digital data output from a serial/parallel converter 32 so that an electric current I from the constant-current source 31 can be controlled variably according to setting of the switches 33a, . . . , 33c and sent as an output. The data input to the D/A converter 33, as shown in FIG. 5A, are parallel data (D1, D2, . . . ) into which regulating data (DATA) output from a control microcomputer, not shown, have been converted by the serial/parallel converter 32. The output of the D/A converter 33 is input to a variable filter 34 (e.g., variable delay equalizer) as a biased signal. A signal from a 1H delay unit 40 is also input to the variable filter 34 and output therefrom after a definite-time delay. A relationship among the input/output signals of the 1H delay unit 40 and the variable filter 34 is shown in FIG. 5B.

In such a structure, the outside volume 50 is controlled to correct cut-off frequencies of the variable filters 35, 36 and disorder of Q values resulting from disordered response characteristics of internal elements, such as resistors, capacitors and transistors.

The variable filters 35, 36 are used for band-limitation of the Y signal in the LPF 212, low chroma-band extraction (NTSC: 743 KHz, PAL: 732 KHz) of the C signal in the LPF 218 after frequency conversion, DC reproduction of the Y signal in the LPF 222 after FM demodulation, fsc ±500 KHz chroma-band extraction of the C signal in the BPF 226 after frequency conversion, and such.

The electric current regulated with the volume 50 is input to the D/A converter 33 as a reference current and to the variable filter 34 through the D/A converter 33 simultaneously when it is input to the variable filters 35, 36, so that disorder of the amount delayed by the variable filter (variable delay equalizer) 34 resulting from the disorder of the internal elements, such as resistors, capacitors and transistors, can be corrected.

Further, the variable filter 34 can correct disorder of the external 1H delay unit 40 in addition to the correction of the disordered delay amount resulting from the disorder of the internal elements, such as resistors, capacitors and transistors, by controlling digital data input to the D/A converter 33.

In the embodiment, although the serial/parallel converter 32 is mounted on one chip of the YC separator, parallel data may be directly input from the outside.

Further, although the embodiment described how the disorder of the internal elements would be corrected, the present invention is not limited thereto, and the same structure and process can be applied to changes in cut-off frequency or Q value of the variable filters by switching the mode or the like.

As described above, according to the embodiment, an external communication means (serial/parallel converter 32) is provided for setting the amount corrected by the variable filter 34, so that the amount corrected by the variable filter 34 can be automatically set based on the input from the outside.

(Second Embodiment)

Figure 7:
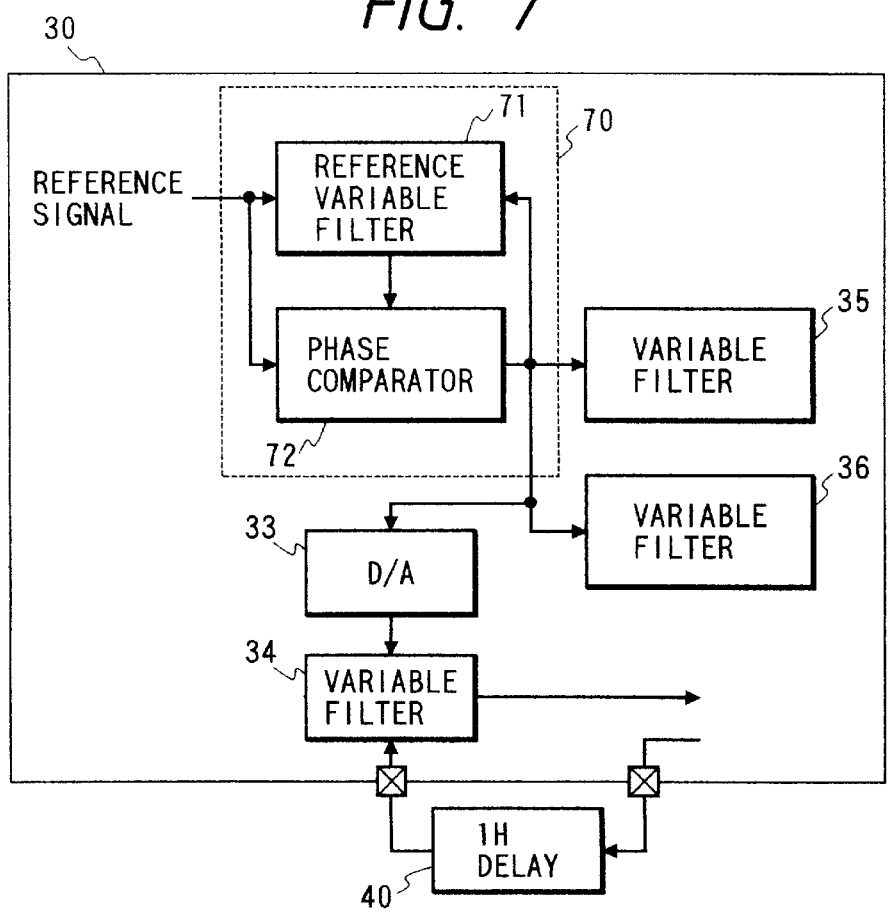
FIG. 7 is a block diagram showing the main part of an integrated circuit according to a second embodiment of the present invention.
Figure 8:
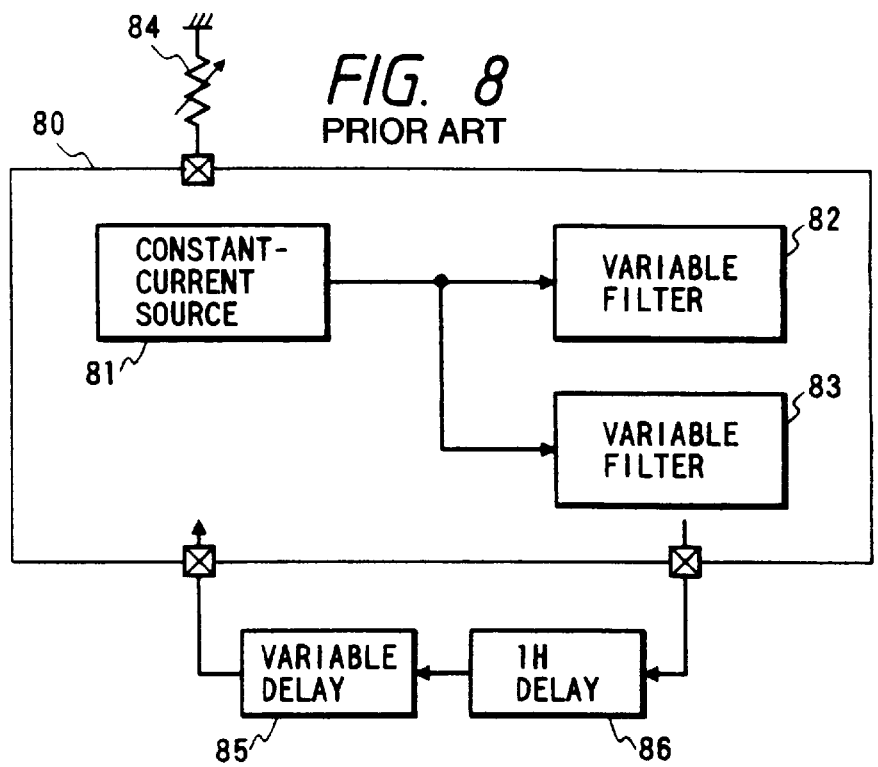
FIG. 8 is a block diagram showing the main part of a conventional integrated circuit.
Figure 9:
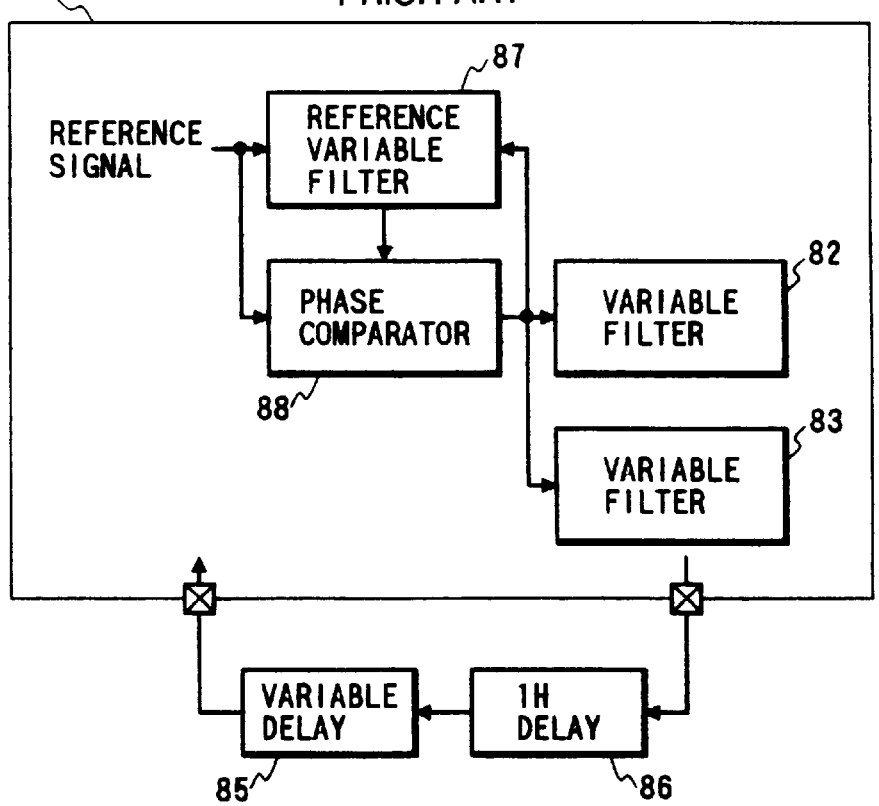
FIG. 9 is a block diagram showing the main part of another conventional integrated circuit.

FIG. 7 is a block diagram showing the main part of an integrated circuit according to a second embodiment of the present invention, where portions common to those in FIG. 3 are given the same numerals.

In FIG. 7, the integrated circuit (YC separator) 30 is provided with a reference variable filter 71 and a phase comparator 72.

A reference signal having a prescribed frequency is input from a reference signal source, not shown, to the reference variable filter 71. The output of the reference variable filter 71 is then input to the phase comparator 72. The phase comparator 72 compares an output signal's phase of the reference variable filter 71 with the phase of the reference signal, converts an error signal obtained from the phase comparison into a current signal for controlling the reference variable filter 71 and feeds back it to the reference variable filter 71.

In such a loop, a phase difference between signals input to the phase comparator 72, i.e., a cut-off frequency of the reference variable filter 71 can be automatically set to a prescribed value under control.

The bias current of the reference variable filter 71 automatically controlled in the loop is mirrored and input both to the variable filters 35, 36 as biased signals and to the D/A converter 33 as a reference signal.

The following operation of the D/A converter 33, the variable filter 34 and the 1H delay unit 40 is the same as in the first embodiment.

In the integrated circuit 30 such above, an automatic adjusting loop processor 70 is automatically controlled to correct the cut-off frequencies, the disordered Q values and the temperature characteristics of the reference variable filter 71 and the variable filters 35, 36 resulting from the disorder of the internal elements, such as resistors, capacitors and transistors, and their temperature characteristics.

At the same time, the constant current biased under control controls digital data (regulating data) input to the D/A converter 33, so that disorder of the variable filter (variable delay equalizer) 34 and its temperature characteristic resulting from the disorder of the internal elements, such as resistors, capacitors and transistors, and their temperature characteristics are also corrected.

Further, the digital data (regulating data) input to the D/A converter 33 is controlled so that disorder of the 1H delay unit 40 can be corrected while correcting the disordered delay amount of the variable filter 34 and its temperature characteristic resulting from the disorder of the internal elements, such as resistors, capacitors and transistors, and their temperature characteristics.

As described above, according to the present invention, correction means performs digital/analog conversion of a control signal adjusted by first adjustment means into a reference signal of a digital/analog converter so that the amount adjusted by second adjustment means can be corrected, and this makes it possible not only to incorporate the correction means for correcting the disordered response characteristics of the external element into the circuit substrate, but also to correct the disorder of the external element following the output from the first adjustment means.

Further, the amount corrected in the second adjustment means which is derived from the correction means is set through external communication means, so that the process of setting the corrected amount can be easily automated.

Furthermore, a control signal applied to a first variable filter is adjusted inside or from the outside, the digital/analog conversion of the adjusted control signal into a reference signal for the digital/analog conversion is performed, and a second variable filter is corrected based on the converted control signal, so that the disordered response characteristics of the external element can be corrected following the adjustment of the disordered response characteristics and temperature characteristics of the elements integrated within the circuit.

Furthermore, the amount required for correcting the second variable filter is set through a communication port based on the converted control signal, thereby easily automating the process of setting the corrected amount.

Accordingly, the present invention displays the effects of reducing the substrate area and automatically correcting the disordered response characteristics of the external element following the adjustment of the disordered response characteristics and temperature characteristics of the internal elements of the integrated circuit.

What is claimed is:

1. An integrated circuit comprising:

first adjustment means for adjusting disordered response characteristics and/or temperature characteristics of elements integrated within the circuit and for adjusting a control signal;

conversion means for performing digital/analog conversion of the control signal adjusted by said first adjustment means into a reference signal based on data input from an external circuit; and second adjustment means for adjusting disordered response characteristics of an element externally connected to the circuit in accordance with the reference signal.

2. The integrated circuit according to claim 1, further comprising external communication means for receiving the data input from the external circuit.

3. A variable filter adjustment method for an integrated circuit comprising the steps of:

adjusting disordered response characteristics and temperature characteristics of elements integrated within the circuit and adjusting a control signal;

performing digital/analog conversion of the control signal adjusted in said first adjusting step into a reference signal based on data input from an external circuit; and adjusting disordered response characteristics of an element externally connected to the circuit in accordance with the reference signal.

4. The method according to claim 3, further comprising a step of receiving the data input from the external circuit through a communication port.

5. The integrated circuit according to claim 1, wherein the external circuit comprises a microcomputer.

6. The integrated circuit according to claim 1, wherein the externally connected element comprises a delay circuit.

7. The integrated circuit according to claim 6, wherein the delay circuit is supplied with an image signal.

8. The integrated circuit according to claim 2, wherein said communication means comprises second conversion means for converting serial data into parallel data.

9. The method according to claim 3, wherein the external circuit comprises a microcomputer.

10. The method according to claim 3, wherein the externally connected element comprises a delay circuit.

11. The method according to claim 10, wherein the delay circuit is supplied with an image signal.

12. The method according to claim 4, wherein said communication step comprises a step of converting serial data into parallel data.

* * * * *